United States Patent [19]

Anderson et al.

[11] Patent Number: 4,890,382

[45] Date of Patent: Jan. 2, 1990

[54] APPARATUS FOR USE IN ASSEMBLING ELECTRICAL CONNECTORS

[75] Inventors: Leslie A. Anderson, Bothell; Eric J. Selby, Everett; David L. Wagner, Kent; Alfred E. Walter, Jr., Everett, all of Wash.

[73] Assignee: The Boeing Company, Seattle, Wash.

[21] Appl. No.: 291,557

[22] Filed: Dec. 28, 1988

[51] Int. Cl.[4] .......................... H05K 3/30; B21P 21/00

[52] U.S. Cl. .......................................... 29/833; 29/721; 29/739; 29/747; 324/66

[58] Field of Search ............... 140/93 R; 29/747, 720, 29/721, 739, 833, 845; 324/66

[56] References Cited

U.S. PATENT DOCUMENTS

| | | | |
|---|---|---|---|
| 3,840,962 | 10/1974 | Coller | 29/739 X |
| 4,183,091 | 1/1980 | Murai | 365/51 |
| 4,290,178 | 9/1981 | Friese | 29/739 X |
| 4,429,456 | 2/1984 | Zahn | 29/739 X |
| 4,727,637 | 3/1988 | Buckwitz et al. | 29/739 X |
| 4,745,681 | 5/1988 | Hollis, Jr. et al. | 29/739 X |

FOREIGN PATENT DOCUMENTS

| | | | |
|---|---|---|---|
| 678569 | 8/1979 | U.S.S.R. | 29/747 |

OTHER PUBLICATIONS

Conf 10th Annual Connector Symposium Proc., Cherry Hill, N.J., U.S.A. 10/1977, pp. 44–48.

*Primary Examiner*—Howard N. Goldberg
*Assistant Examiner*—Carl J. Arles
*Attorney, Agent, or Firm*—Dellett, Smith-Hill & Bedell

[57] ABSTRACT

The present invention constitutes an apparatus for assembling multiple electrical contacts and filler elements into an electrical connector. The apparatus includes a filler assembly for automatically installing filler elements into the holes within the electrical connector which are to be unoccupied by electrical contacts, and a guide assembly which is functional for assisting the operator in manually inserting the electrical contacts into the correct holes within the connector by providing a visual indication of the holes into which the contacts should be inserted. The filler and guide assemblies operate on connectors held into position on a turntable-like indexing plate which allows the connectors to be rotated alternatively into position with respect to each of the assemblies. The filler assembly includes one or more filler element inserter tools which are adapted for inserting filler material from strands of such material into the holes within the connectors so as to form installed filler elements.

22 Claims, 11 Drawing Sheets

APPARATUS FOR USE IN ASSEMBLING ELECTRICAL CONNECTORS

The present invention relates to methods and devices for use in assembling electrical contacts into electrical connectors.

BACKGROUND OF THE INVENTION

Bundles of wires carrying multiple signals are usually connected to other similar bundles or interfaced to devices such as instruments and control mechanisms through the use of electrical connectors into which contacts corresponding to the individual wires of the bundles are assembled. The connectors allow leads from the wires to be brought into an orderly mating relationship with conductive leads from other wire bundles, instruments, or control mechanisms.

It is conventional for a connector to comprise a pair of cylindrical shells which are adapted for fitting together in a single prescribed manner. Each such shell includes a contact receiving insert. Each insert is made of a dielectric material and is in the form of a plate having an inner surface which is intended to confront the other insert within the connector and an opposite outer surface which is parallel to the inner surface. Numerous holes penetrate the inserts opening at their opposite ends to the inner and outer surfaces of the inserts.

A wire is prepared for attachment to the connector by stripping the dielectric sleeve from the end of the wire so as to expose its conductive core and crimping a contact onto the conductor. This contact may be in the form of either a pin or a pin receiving receptacle. The contact is introduced into a hole in an insert by way of the outer surface thereof and, in the case of a pin, projects beyond the inner surface of the insert. When all the wires have been attached to their respective inserts and the inserts are brought together, the contacts that are received in the holes of one insert are physically engaged by the contacts that are received in the holes of the matching insert within the connector.

In many cases, the number of holes within connectors turns out to be greater than the number of wires to be attached thereto. For many applications, the connector must be sealed by filling the unused holes with filler elements of a non-conductive material, e.g. to prevent unwanted air leaks.

When attaching a breakout or "bundle" of wires from a wiring harness to a particular connector, it is necessary to insure that the contacts and filler elements are located in the proper holes of the insert since otherwise the right circuits will not be completed when it is coupled to its mating insert within the connector.

One method of insuring that the contacts and filler elements are positioned in the proper holes involves the use of a plug map. Each hole in the insert is numbered and each wire is labeled to carry an identifying number specific to the wire. The plug map correlates the wire numbers with the hole numbers. The user selects a wire for attachment to the connector, reads the wire number, consults the plug map to find the number of the hole associated with the selected wire, scans the plug to locate that hole, and inserts the contact of the selected wire into the hole. Therefore, use of a plug map is subject to a disadvantage in that it involves carrying out a random search of the plug map for the wire number and then searching the connector itself to find the corresponding hole. Consequently, attaching the wires to the connector using a plug map in this manner is time consuming and, furthermore, is subject to error in that it is easy to confuse the wire numbers on the plug map and to mistake one hole location for another.

In an automated robotic connector assembly machine, the operations of wire stripping, contact crimping and insertion are performed automatically. However, the wires and filler elements must first be dressed into predetermined locations in a fixture associated with the assembly machine. Therefore, this technique involves a high capital cost while still involving a substantial amount of manual labor.

In a cable scan system, the operator touches the contact of a selected wire to an electrode which receives a signal over the wire. This signal represents the wire number in encoded form, and is decoded and applied to an electronic lookup table. The lookup table contains the plug map and provides the operator with the hole number without its being necessary for the operator to scan a plug map. However, this system is only applicable when the opposite end of the selected wire is connected to a signal source, i.e., has already been attached to its own connector, and does not relieve the operator of the burden of searching the insert plate for the hole having the number provided by the lookup table. Further, this system is not in any way helpful in assembling non-conductive filler elements into the connector.

Several methods have been proposed for assisting in identifying the correct hole for receiving a particular contact or filler element. For example, U. S. Pat. No. 3,706,134 (Sweeney et al) addresses the problem of locating the correct hole number when the density of holes is high and the numbers imprinted on the connector are small. The connector is fitted over an array of optical fibers such that the fibers are positioned beneath specific holes. An input panel which constitutes an enlarged replica of the outer surface of the connector is formed with an aperture for each hole in the connector. The optical fibers couple the apertures in the panel with the corresponding holes in the connector. Therefore, when a light source is placed in an aperture of the panel, light is emitted from the corresponding hole in the connector. The operator is thereby able to identify the holes by reference to the much larger panel, which facilitates correct identification of the holes. However, this does not alleviate the difficulty associated with searching a plug map, and moreover because connector blocks are of significant depth and the holes are generally quite narrow, it can be difficult to spot which hole is in fact emitting light.

In U. S. Pat. No. 4,727,637 (Buckwitz et al) a method and apparatus is disclosed for assisting in the insertion of electrical contacts into connectors by visually identifying the locations of specific holes within electrical connectors. A fiber optic rod attached at one end to a light source is adapted for being directed into the holes to be identified so that the other end of the rod projects above the holes and can be easily spotted by an operator of the apparatus. In operation, the fiber optic rod is advanced into and retracted out of the holes within the connector corresponding to specific wires selected by the operator as the operator one by one either inserts electrical contacts for the wires or filler rods into each of the holes. The system is effective but still relies on considerable manual effort in installing filler rods which may be numerous, resulting in many time consuming steps.

It is therefore an object of the present invention to provide an improved system for assembling electrical connectors which includes a mechanism for automatically installing filler elements into the connector without manual assistance.

It is another object of the present invention to provide an improved system for assembling electrical connectors which conveniently positions electrical connectors for rapid operation with respect to insertion of electrical contacts and installation of filler rods.

It is a further object of the present invention to provide an improved system for assembling electrical connectors which is effective in providing increased operational efficiency in the assembly process.

SUMMARY OF THE INVENTION

The present invention comprises an apparatus for assembling multiple electrical contacts and filler elements into an electrical connector. The apparatus includes a filler assembly for automatically inserting filler elements into the holes within electrical connectors and a guide assembly for assisting operators in inserting electrical contacts into selected holes within the same connectors. The filler and guide assemblies operate on connectors held in position on a turntable-like indexing plate which allows the connectors to be conveniently rotated into position with respect to each of these assemblies.

The filler assembly comprises one or more filler element inserter tools adapted for inserting lengths of filler material from strands of such material into the holes within connectors and clipping off the strands so as to form installed filler elements or "filler rods". The inserter tools are mounted on a frame attached to an X-Y table operative for transversely positioning the inserter tools so that they may be sequentially located over all of the unused or "vacant" holes in particular connectors secured onto the indexing plate.

The guide assembly comprises a drive cylinder adapted for advancing and retracting an optical element for use in identifying the location of particular holes on connectors secured onto the indexing plate. The guide assembly is also mounted on an X-Y table operative for transversely positioning the optical element so that it can be advanced and retracted with respect to specific holes in the connectors.

The overall operation of the apparatus is regulated by a microcomputer that coordinates and controls the functioning of the components of the system. In particular, the microcomputer in its associated software provides a lookup table function which automatically cross-references electrical contacts and/or filler elements to the particular holes into which they should be inserted.

In operation, a connector is first secured onto the indexing plate and rotated into position below the inserter tools of the filler assembly. Under control of the microprocessor, an appropriate inserter tool is sequentially positioned over the vacant holes in the connector and one by one filler elements are installed into these holes. The connector is then rotated into position above the guide assembly at a location where the operator can work in cooperation with the apparatus for manually inserting electrical contacts into the connector. Under control of the microprocessor, the drive cylinder and optical element are positioned under particular holes corresponding to electrical contacts of specific wires identified by the operator. The optical element is then advanced into the designated hole and illuminates the hole and the area above it, thereby providing an indication to the operator of the hole into which the particular contact should be inserted. The operator then signals the guide assembly to retract the optical element and manually inserts the electrical contact into the identified hole. The foregoing process is repeated until all of the required electrical contacts are one by one inserted into their proper holes within the connector and the assembly of the connector is thereby fully completed.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
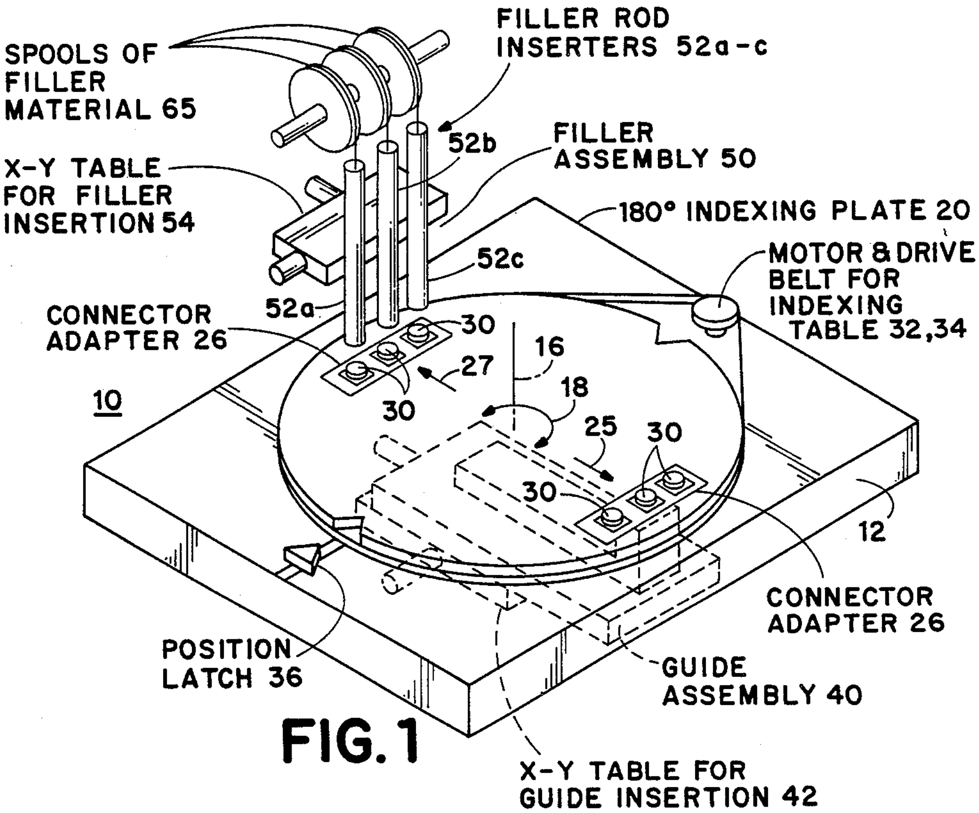
FIG. 1 is a diagrammatic perspective view of the overall layout of one embodiment of the present invention.

Referring now to the drawings and particularly to FIG. 1, the present invention comprises a workstation 10 including a table 12 and a shelf 14 located underneath the table 12. A circular indexing plate 20 is mounted on the table 12 so as to be rotatable around the axis 16 as illustrated by the arrow 18. A pair of adapter fittings 26 which are designed for holding electrical connectors such as the connectors 30 are secured on opposite sides of the plate 20. The indexing plate 20 allows the connectors 30 to be alternatively secured at position 25 for the insertion of electrical contacts or at position 27 for the installation of filler rod elements in accordance with 180° rotation of the plate 20.

When at the forward position 25, connectors 30 are located above the optical guide assembly 40 mounted on the X-Y table 42 for transversely positioning the assembly 40 with respect to the holes within these connectors. The guide assembly 40 functions to insert an optical guide element into selected holes within the connectors 30 as determined by the positioning of the table 42.

When at the rearward position 27, connectors 30 are located below the filler assembly 50 (and more particularly the filler element inserter tools 52*a–c*) mounted on the X-Y table 54 for positioning with respect to the holes within these connectors. The filler assembly 50 functions to insert filler elements into selected holes within the connectors 30 as determined by the positioning of the table 54. The different spools 65 furnish different sizes of filler material 24 such as nylon to the inserter tools 52*a–c*, that function independently to install filler elements of different diameters in the different styles of connectors as may be held by the adapter fittings 26. The motor 32 and drive belt 34 revolve the indexing plate 20 in accordance with computer generated commands while the latch 36 helps secure the plate accurately in position so that the connectors 30 held by the adapter fittings 26 are precisely located with respect to the assemblies 40 and 50.

Figure 2A:
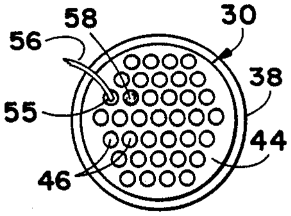
FIGS. 2A and 2B are a top view and partially cutaway side view, respectively, of an electrical connector of the type operated on by the present invention.
Figure 2B:
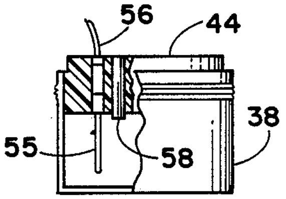

Referring now to FIGS. 2A–B, a typical connector 30 includes an outer shell 38 and an insert plate 44 having a multiple number of holes such as the holes 46 into which electrical contacts may be inserted. It should be noted that a fully assembled connector 30 would also include a second shell (not shown) and corresponding insert plate (not shown) capable of holding electrical contacts adapted for junctioning with contacts installed in the (first) insert plate 44. An electrical contact 55 attached to a signal wire 56 is shown as inserted into one of the holes in the insert plate 44. Further, a filler element or rod 58 is shown as inserted into another one of the holes in the insert plate 44.

Figure 3:
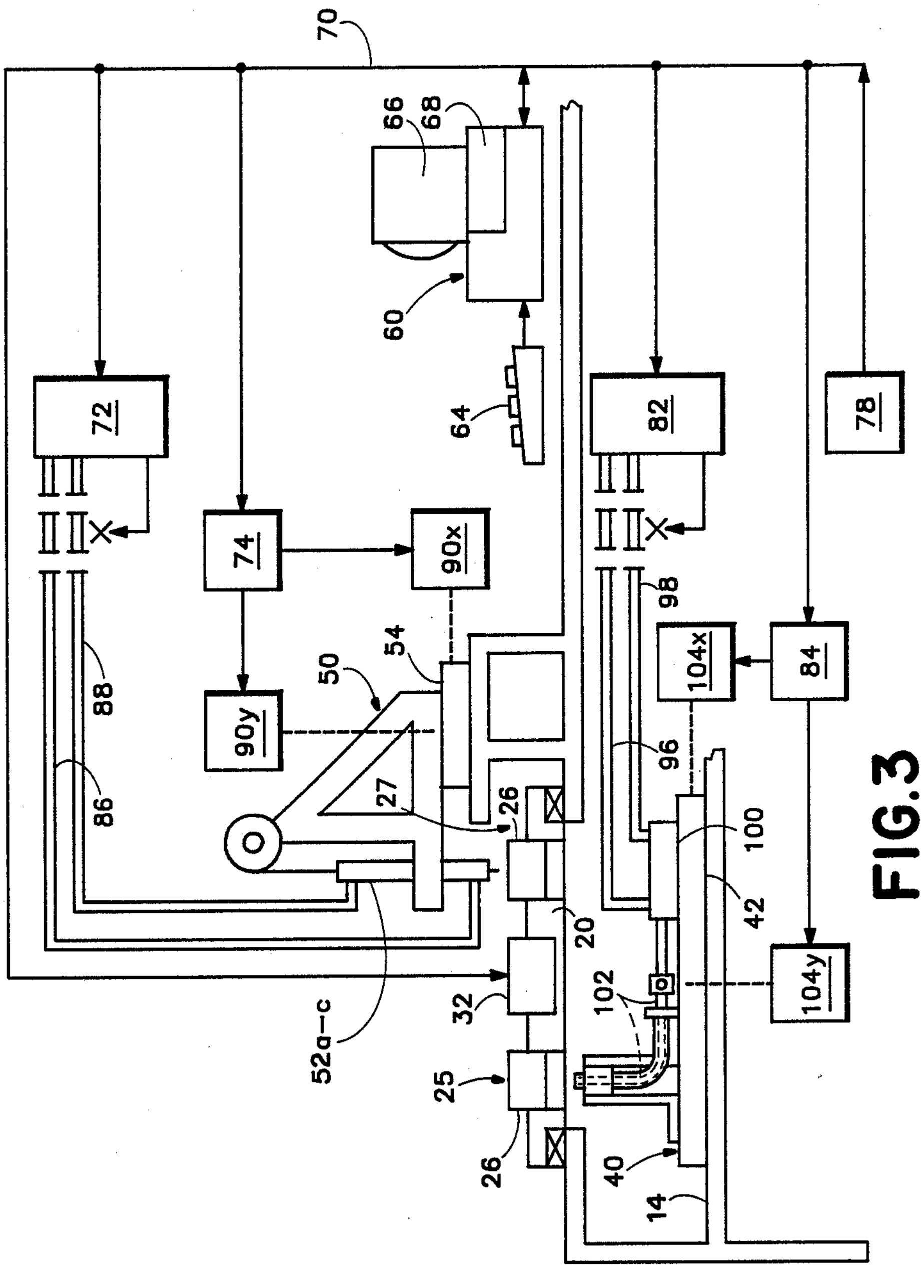
FIG. 3 is a functional block diagram of one embodiment of the present invention showing various components of the systems of the invention and especially the interconnections between these components.

Referring now to FIG. 3, the operations of the components of the system of the present invention are controlled by a computer system 60 such as an IBM PC/AT having a processor employing an Intel 80286 processing chip functioning in accordance with a software program, later described. A keyboard 64, monitor 66 and memory unit 68 are associated with the computer system 60 for allowing the input of commands and data by the operator of the system and the output of information from the system. A bus 70 connects the computer system 60 to various components of the overall apparatus including a valve controller 72 and X-Y table controller 74 which are associated with the filler assembly 50 and a valve controller 82 and X-Y table controller 84 associated with the guide assembly 40. The computer system 60 is also connected to the indexing plate motor 34 and a foot switch 78 via the bus 70.

The valve controller 72 regulates the flow of air through the pneumatic lines 86 and 88 to the filler rod inserter tools 52*a–c*, the latter comprising primary operating components of the filler assembly 50. The X-Y table controller 74 drives the servomotors 90*x* and 90*y* for displacing the X-Y table 54 and horizontally positioning the filler assembly 50 and the filler inserter tools 52*a–c* with respect to connectors 30 held by the adapter fittings 26 at position 27. The valve controller 82 regulates the flow of air through the pneumatic lines 96 and 98 to the drive cylinder 100 and vertically displaces a fiber optic element 102 with respect to the connectors 30 held by the adapter fittings 26 at position 25. The X-Y table controller 84 drives the servomotors 104*x* and 104*y* that displace the X-Y table 42 and horizontally position the optical element 102 with respect to connectors in the adapter fittings 26 at position 25. The indexing motor 32 comprises a stepper motor responsive to pulse signals from the computer for rotating the indexing plate 20 into one or the other of the operative positions whereby the adapter fittings 26 may be properly oriented with respect to the filler assembly 50 and the guide assembly 40. The foot switch 78 allows the operator to conveniently provide signals to the computer system 60 without having to use of the keyboard 64.

Figure 4B:
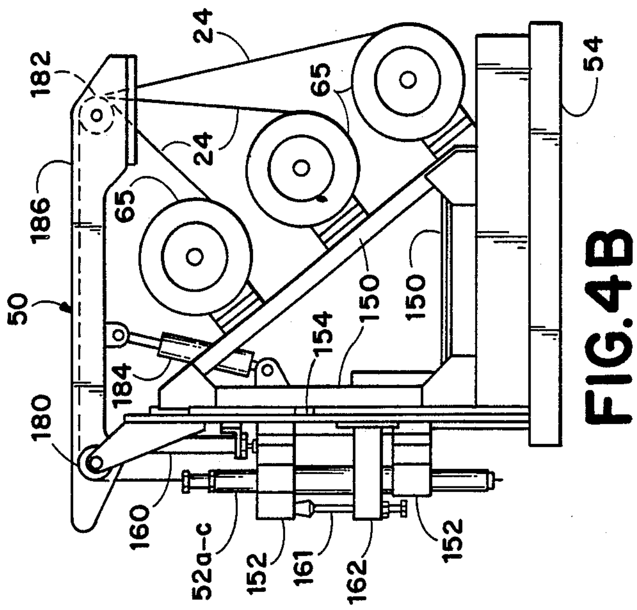
FIGS. 4A and 4B are front and side views, respectively, of a filler assembly component in accordance with one embodiment of the present invention.
Figure 4A:
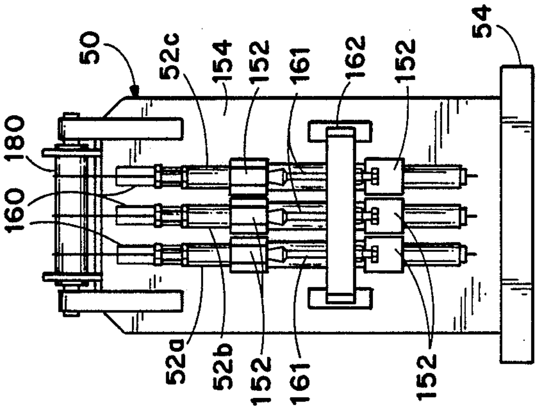

Referring now to FIGS. 4A–B, the filler rod assembly 50 comprises a triangular frame 150 on which the filler rod inserter tools 52*a–c* are slidably mounted. Each one of the inserter tools 52*a–c* includes a pair of brackets 152 engaged into vertical channels attached to the plate 154 secured to the frame 150 so as to allow the inserter tools 52*a–c* to move downwardly toward the indexing plate 20 for installation operations and upwardly away from the plate 20 in order to allow the plate to rotate freely without obstruction. A set of pneumatic cylinders 160 regulate positioning of the inserter tools 52*a–c* in response to pneumatic signals from valve controllers under control of the computer system 60. The retainers 161 separately limit the travel of each of the inserter tools 52*a–c* by stopping up against the bracket 162. Spools 65 of filler rod material 24 are secured to the backside of the frame 150 and function to supply separate strands of filler rod material 24 over the rollers 180 and 182, mounted on arm 186, to the inserter tools 52*a–c*. The pneumatic cylinder 184 is pneumatically actuated under control of the computer system 60 and facilitates the supply of filler rod material 24 by pulling material off the spools 65 as it pivots the arm 186 upward.

Figure 5:
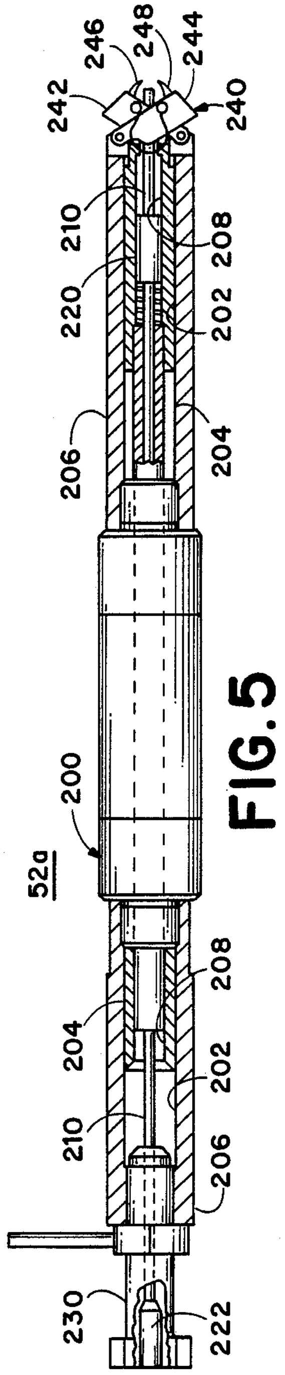
FIG. 5 is a partial cross-sectional view of an inserter tool component in accordance with one embodiment of the present invention for use in the filler assembly shown in FIGS. 4A and 4B.

Referring now to FIG. 5, the filler rod inserter tool 52*a* comprises a double acting pneumatic cylinder 200 having an outside casing 206 and a hollow bore 202 running throughout its length. A piston 204 is disposed in the bore 202 and is adapted for executing upward and downward strokes with respect to the casing 206. The piston also includes a hollow chamber 208 running throughout its length and through which a strand 210 of filler material 24 extends from the top to the bottom of the cylinder 200.

The cylinder 200 includes a pair of one-way clutch mechanisms 220 and 222 which operate on the strand 210 of filler material extending through the cylinder 200. The first clutch mechanism 220 is secured at the bottom end of the piston 204 and functions to grasp the strand 210 of filler material so that it moves with the piston during its downward stroke. The second clutch mechanism 222 is secured at the top end of the cylinder 200 and functions to grasp the strand 210 of filler material and hold it stationary as the piston 204 moves upwardly so that the piston may be "recharged" with a new length of filler material as it makes its upward stroke. The cylinder 200 also includes a bolt 230 attached to the top end of the casing 206 of the cylinder 200 and functioning as a stop for limiting the length of the stroke of the piston 204. Further, the cylinder 200 includes the clipping mechanism 240 comprising a pair of jaws 242 and 244 pivoted from opposite sides of the cylinder 200 having blades 246 and 248 attached to their distal ends. The jaws 240 and 242 are operated by an arm attached to the piston 204 and rotate counter-directionally in response to the downward stroke of the piston thereby bringing the blades 246 and 248 together and severing the strand 210 of filler material at the end of the downward stroke of the piston 204.

Figure 6B:
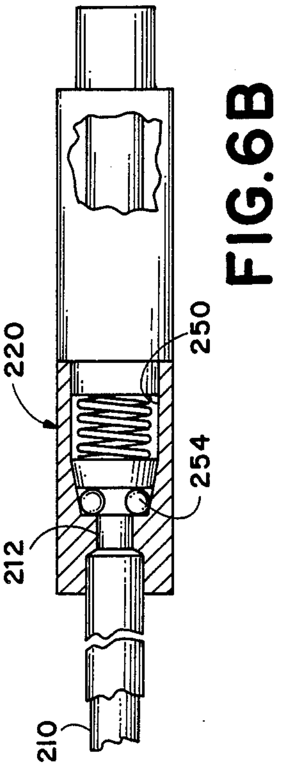
FIGS. 6A and 6B are cross-sectional views of clutch mechanisms in accordance with one embodiment of the present invention which are part of the inserter tool shown in FIG. 5.
Figure 6A:
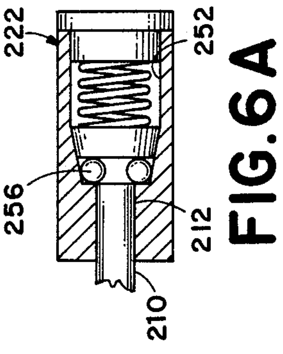
Figure 7:
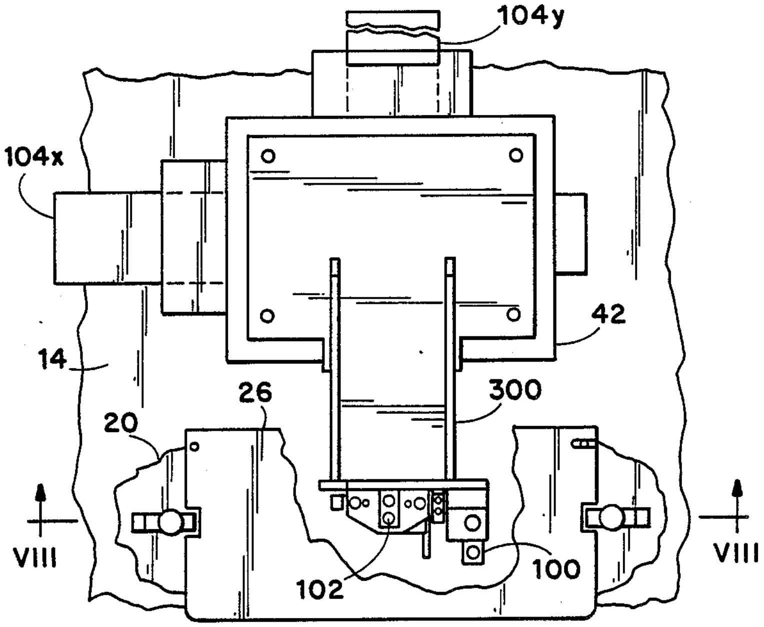
FIG. 7 is a top view of a guide assembly component in accordance with one embodiment of the present invention.

Referring now to FIGS. 6A-B, the clutch mechanisms 220 and 222 are shown as including conically shaped chambers 250 and 252 constructed so as to be concentric to the strand 210 of filler element material extending through the cylinder 200. Sets 254 and 256 of ball bearings are spring loaded into the conical chambers 250 and 252 toward the vertex end of the chambers so as to bear on the outside surface 212 of the strand 210 of filler material while being retained within the chambers 250 and 252. The sets 254 and 256 of ball bearings wedge themselves between the surface 212 of the filler material and the tapering walls of the conical chambers 250 and 252 thereby preventing the strand 210 of filler material from moving in the direction of the narrower ends of the conical chambers 250 and 252 or leftward as shown in FIGS. 6A–B.

In operation of the filler assembly shown in FIGS. 4A–B, the filler rod inserter tools 52*a–c* are initially located at their uppermost positions retracted away from the indexing plate 20. After a connector 30 into which filler rods are to be installed is rotated into position below the inserter tools 52*a–c*, the filler rod inserter tool handling the correctly sized filler material is advanced downward to the extent allowed by the retainer 161 attached to the tool so that the bottom tip of the selected inserter tool is in immediate proximity to the surface of the connector. The selected inserter tool is advanced through the action of the pneumatic cylinder 160 connected to the bracket 152 secured to the tool. Once one of the inserter 52*a–c* is advanced into vertical proximity with the connector into which filler rod elements are to be inserted, the X-Y table 54 is translated by the servomotors 90*x* and 90*y* so as to horizontally position this inserter tool over one of the unoccupied holes in the connector 30. The pneumatic cylinder 184 is then actuated for lifting the arm 186 and drawing filler material 24 off the spools 65 in order to provide some operational slack in the strands 210 of filler material supplied over the rollers 182 and 180 to the inserter tools 52*a–c*.

The selected inserter tool itself is then activated for installation of the actual filler rod element. The piston 204 is pneumatically driven to execute its downstroke carrying with it the strand 210 of filler material extending through the cylinder 200 which is held by the clutch 220 and slipped by the clutch 222. The strand 210 is driven downwardly from the tip of the inserter tool into the hole within the connector with which the inserter tool is aligned. As the piston 204 reaches the end of its downstroke, it contacts the jaws 242 and 244 forcing the blades 246 and 248 together so as to sever the strand 210 of filler rod material immediately above the surface of the connector thereby forming an installed filler rod element. The piston 204 is then pneumatically driven to execute its upstroke during which the clutch 220 slips the strand 210 while the clutch 222 holds the strand 210 stationary with respect to the casing 206 of the cylinder 200 so that a length of filler material equivalent to a filler rod element is allowed to accumulate below and extend out from the bottom end of the piston 204. The selected inserter tool from among the tools 52*a–c* is sequentially aligned with each of the unused holes within the connector into which filler rod elements are required to be inserted and the operations of the inserter tool described above are repeated until all of the unused holes within the connector have been filled with filler rod elements. Thereafter, the pneumatic cylinder 160 is actuated to retract the selected inserter tool away from the connector 30 and indexing plate 20 so that the connector 30 can be rotated to the forward position 25 at which electrical contacts can be installed in the connector and/or a new connector 30 can be positioned under the inserter tools 52*a–c* for installation of filler rod elements.

As shown in FIGS. 7, 8 and 9A–B, the X-Y table 42 is mounted on the shelf 14 and supports a frame 300 for carrying the double-acting drive cylinder 100 in a vertical orientation. The outer end of the piston rod 302 is coupled to a toothed rack 304 in meshing engagement with a pinion (not shown) carried by a spindle 306. The spindle 306 is disposed horizontally, and is mechanically coupled at one end to a crank arm 308. When the cylinder 100 is in its extended condition, the arm 308 is directed downwardly from the spindle 306, and, conversely, when the cylinder 100 is retracted, the arm 308 is directed upwards from the spindle 306 as the rack 304 is driven upwards and the spindle 306 is rotated through a 180° angle. The free end 310 of the arm 308 engages a slot 312 in a cam plate 314 mounted on a carriage 316. The carriage 316 runs on vertical guide rods 318 supported at their opposite ends by the frame 300. The frame 300 also carries a light source 315 both mechanically and optically coupled to the proximal end of the optical element 102 which comprises a fiber optic rod. The element 102 follows a generally U-shaped path, extending downwards from the light source 315 and then upwards through a gripping sleeve 332 attached to the carriage 316.

Above the rods 318, the frame 300 carries a bushing 340 through which a guide sleeve 342 extends. The guide sleeve 342 is disposed coaxially with the gripping sleeve 332 and is longitudinally slidable within the bushing 340. The fiber optic element 102 extends upwards from the gripping sleeve 332 into the guide sleeve 342. At its lower end, the guide sleeve 342 is provided with a collar 346 formed with a peripheral groove 348. The carriage 316 carries a bushing 360 in which a rod 362 is slidably fitted. The rod 362 is disposed vertically and carries a fork 364 at its upper end having prongs which engage the peripheral groove 348 in the collar 346. At its lower end, the rod 362 is coupled to a tension spring 366 attached at its upper end to the carriage 316.

The carriage 316 also mounts a permanent magnet 380, while the support frame 300 is provided with Hall effect sensors 382 and 384 adjacent the path of movement followed by the magnet 380 as the carriage moves vertically along the rods 318.

Figure 9B:
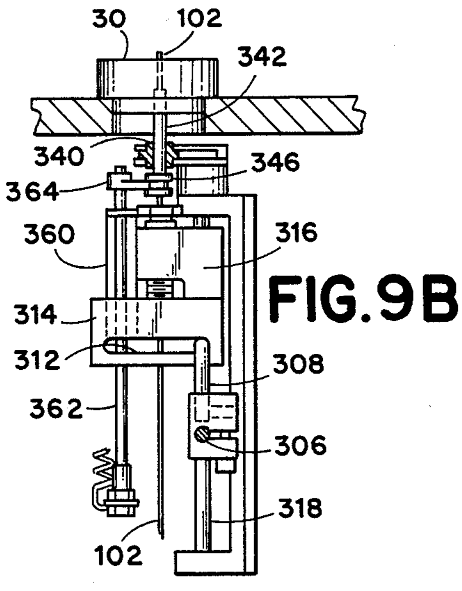
FIGS. 9A and 9B are side views of the structure of the guide assembly shown in FIG. 8 with the optical element illustrated as in its retracted position and advanced position, respectively.
Figure 8:
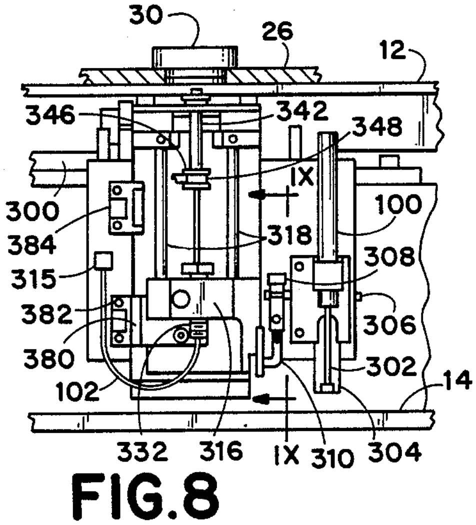
FIG. 8 is a front view of the structure in accordance with one embodiment of the present invention which is part of the guide assembly and is operative for advancing and retracting the optical element used in identifying holes within the connectors.
Figure 9A:
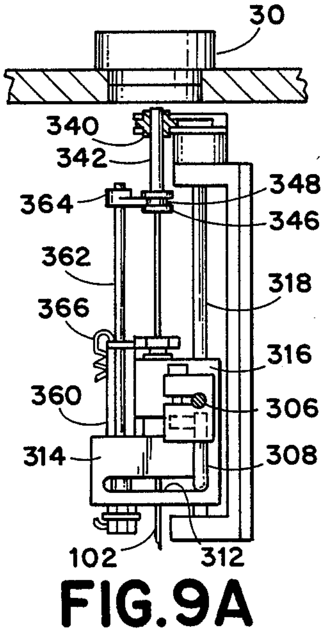

In operation of the structure shown in FIGS. 8 and 9A, the cylinder 100 is initially in its extended condition so that the arm 308 is directed downwards from the spindle 306 and the carriage 316 is accordingly at the bottom of its path of movement along the rods 318. The existence of this condition is communicated to the computer system 60 by a signal provided by the Hall effect sensor 382 in response to proximity of the magnet 380. The motors 104X and 104Y drive the table 42 to bring the distal end of the fiber optic element 102 to its "home" position. When a wire is selected from the bundle of wires that is to be assembled to a connector and the number of this wire is entered into the system 60 via the keyboard 64 or a voice recognition system, then the location of the hole that is to receive the contact attached to the selected wire is retrieved from a lookup table associated with a data base resident in the memory unit 68. The computer system 60 then directs the motors 104X and 104Y to drive the table 42 so as to place the distal end of the fiber optic element 102 directly beneath the correct hole in the connector 30 as identified via the lookup table. The cylinder 100 is then placed in its retracted condition. As the piston rod 302 is withdrawn into the cylinder 100, the arm 308 rotates from its downward position (as shown in FIG. 9A) to the position in which the arm extends upwardly from the spindle 306 (as shown in FIG. 9B) and the carriage 316 is accordingly driven upwards. As the carriage 316 is advanced, the distal end of the fiber optic element 102 is elevated. Due to the connection provided by the tension spring 366, the rod 362, the fork 364 and the collar 346, the guide sleeve 342 is advanced until its upper end engages the inner surface of insert of the connector into which electrical contacts are being inserted. The insert serves as a positive stop with respect to upward movement of the guide sleeve 342, but engagement of the guide sleeve 342 with the insert does not prevent continued upward movement of the carriage 316 because of the spring 366 which couples the rod 362 to the carriage. Therefore, the carriage 316 continues to advance along the rods 318, and the distal end of the fiber optic element 102 advances within the guide sleeve and ultimately projects beyond the guide sleeve 342 and passes upward through the selected hole in the insert. The existence of this condition is communicated to the computer system 60 by a signal provided by the Hall effect sensor 384 in response to proximity of the magnet 380. The operator must then instruct the computer system 60 to withdraw the element 102 from the hole in the insert in order to allow manual insertion of the electrical contact of the selected wire. As the carriage 316 is lowered, the fiber optic element 102 is first withdrawn from insert until its distal end is inside the guide sleeve 342, and ultimately the tension in the spring 366 is relieved sufficiently so that the rod 362 is also lowered and the guide sleeve 342 is brought out of engagement with the insert. This sequence of operations is repeated until all the specified holes in the insert have received electrical contacts.

The flow chart shown in FIGS. 10–15 illustrates the overall method of operation of the software associated with a computer system 60.

Figure 10:
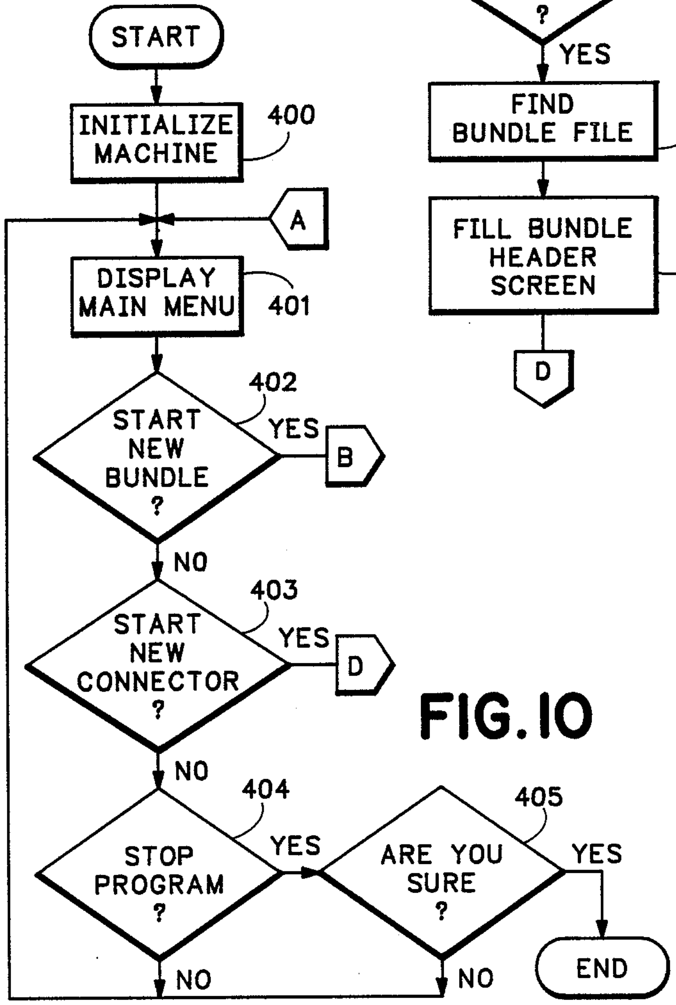

Referring now to FIG. 10, in the first step 400 of the program, the computer system 60 is initialized as the power is turned on. Thereafter, a main menu is displayed on the monitor 66 allowing the operator to interface with the system and to select options corresponding to starting a new bundle of wires, starting a new connector or stopping the program as shown in steps 401, 402, 403 and 404. In the event the operator wishes to start a new bundle or start a new connector, the program proceeds to the routines labeled B and D, respectively, shown in FIGS. 11 and 12. If the operator wishes to stop the program, this decision is first confirmed in step 405 and the program is terminated upon an affirmative response by the operator. Otherwise, the program is returned to the main menu of step 401.

Figure 11:
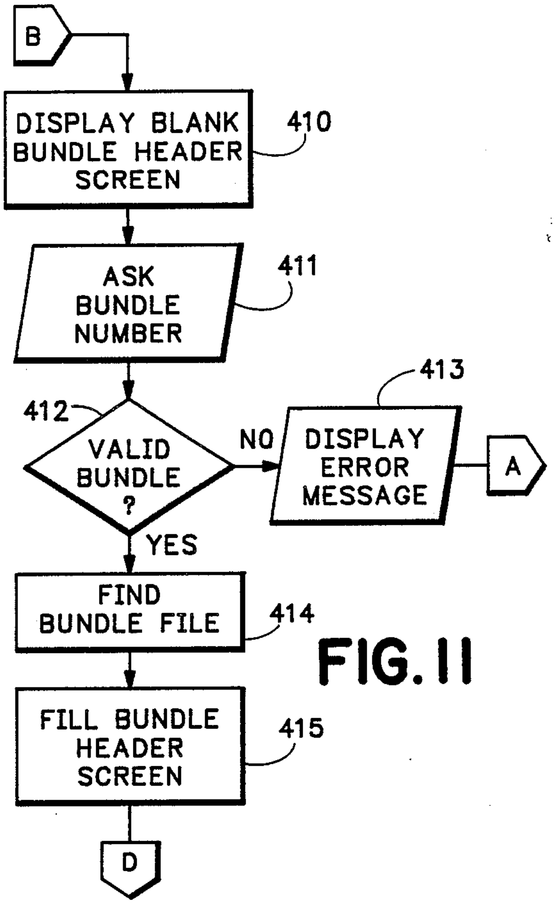
FIGS. 10–17 comprise various software routines for the program in accordance with which the computer system component of the present invention regulates the operation of the overall apparatus of the invention.

Referring now to FIG. 11, in routine B a blank bundle header is first displayed on the monitor 66 pursuant to step 410 and the operator is queried as to the bundle number in step 411. Upon entry of a bundle number by the operator, the program checks in step 412 to make sure that the bundle number is valid and proceeds to display an error message in step 413 and move to main menu of step 401 if it is not. On the other hand, if the bundle number is determined to be valid, the program accesses the corresponding bundle file pursuant to step 414 and appropriately fills the bundle header screen with data from this file in step 415 thereafter proceeding to routine D of FIG. 12.

Figure 12:
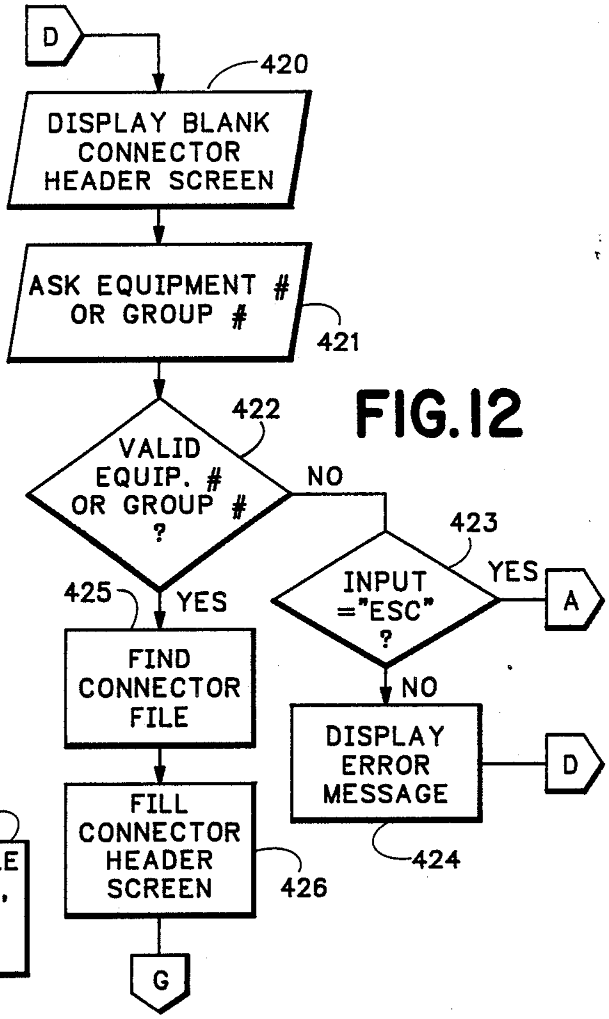

Referring now to FIG. 12, routine D begins with step 420 in which a blank connector header screen is displayed on the monitor 66 and the operator is queried in step 421 as to the equipment number or group number for the connector which he next intends to work on. The program then checks pursuant to step 422 to make sure that the equipment number and group number are valid and proceeds to step 423 if either are invalid. In step 423 the operator is allowed to return to the main menu of step 401 or, alternatively, an error message is displayed in step 424 and routine D is entered again at its beginning. On the other hand, if valid equipment and group numbers are entered, the connector file corresponding to these numbers is accessed in step 425 and the connector header screen is appropriately filled with data from this file in step 426 with the program next executing routine G.

Figure 13:
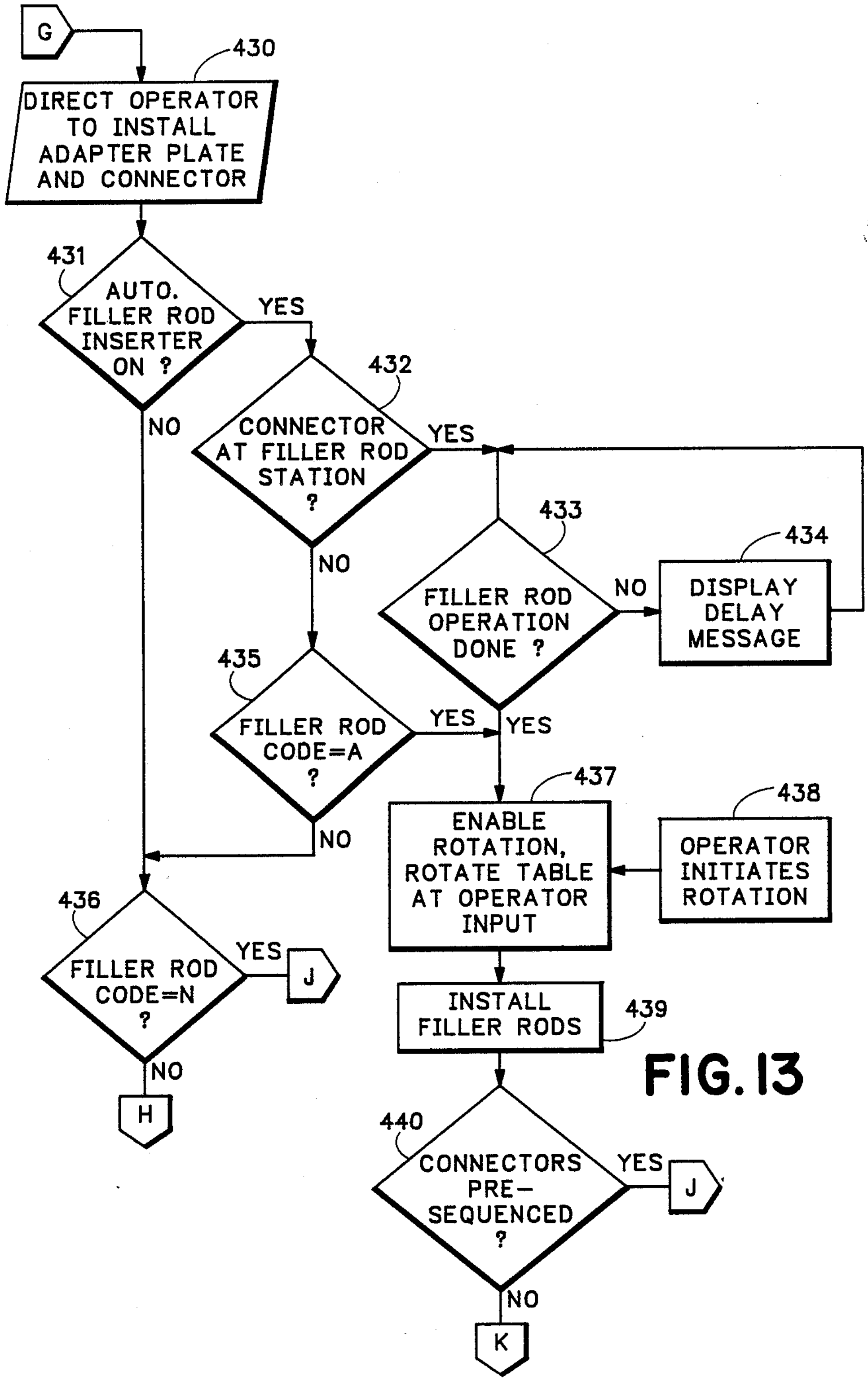

Referring now to FIG. 13, in routine G the operator is first directed in step 430 to install the adapter plate carrying the connector on which he intends to work. In step 431, the program then checks to see whether the automatic filler rod inserter is turned on, and if it is turned on, the program checks further in step 432 as to whether another connector is already present at the filler rod station. If another connector is at the filler rod station, the program executes steps 433 and 434 whereby operations with respect to the newly selected connector are delayed until the filler rod insertion function is complete with respect to the connector already present at the filler rod station. If another connector is not present at the filler rod station, then the program moves to step 435 in which the operator is asked whether the filler rod function should be automatically executed and proceeds to step 436 if the operator answers that the filler rod function should not be automatic. In step 436, the program checks to see whether any filler rods are required to be inserted in this particular connector at all. Routine J is followed if filler rods are not required to be inserted into the connector, or alternatively, routine H is entered if filler rod elements are required to be inserted (non-automatically) into the connector. Upon an affirmative response in either steps 433 or 435 about the completion of filler rod insertion function or the execution of filler rod insertion function in automatic mode, then step 437 is entered in which the rotation of the turn table is enabled and the table is rotated 180° upon an operator input for this procedure as indicated at step 438. Thereafter, in step 439 the filler rods are automatically installed one by one into the connector located at the filler rod station by one or more of the filler rod inserter tools of the filler assembly in accordance with processes previously described with respect to this assembly. The filler rods are automatically entered at locations where conductive elements are not to be entered. When all of the filler rods have been installed in the connector, the program moves to step 440 in which the operator is asked whether the electrical conductors are to be inserted in a presequenced fashion and then either executes routine J if the operator answers affirmatively that presequenced operations are desired or executes routine K if presequenced operations are not indicated as desired.

Figure 14:
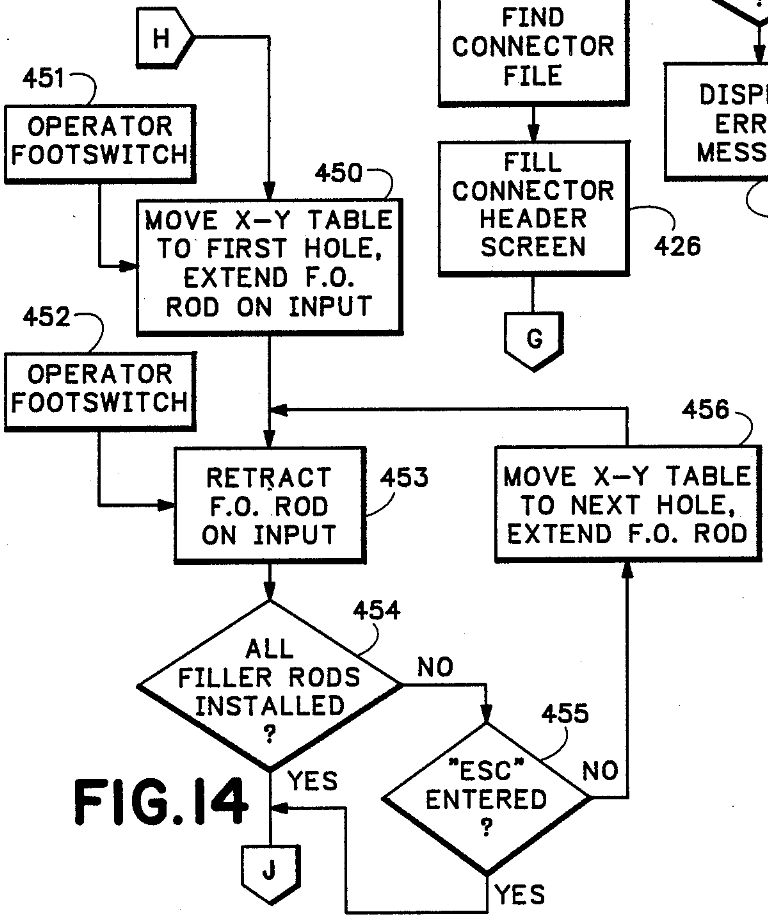

Referring now to FIG. 14, routine H begins in step 450 with the X-Y table 42 of the guide assembly 40 being indexed to position the optical element 102 under the first hole in which a filler element is required to be inserted and with the optical element 102 being extended into this hole upon the operator depressing the foot switch 78 as indicated in step 451. When the operator again depresses the foot switch pursuant to step 452, the optical element 102 is retracted in step 453 so that the operator can manually install a filler rod element in the hole visually indicated by the previous presence of the optical element 102. In step 454 the program checks to see whether all the required filler rods have been installed in the connector and routine J is followed if all of the filler rod elements have been so installed. If additional filler rods remain to be installed, then the program passes to step 455 in which the operator is allowed to escape to routine J or move to step 456 in which the X-Y table 42 supporting the guide assembly 40 is indexed to the next hole and the optical element 102 is extended into this hole. Thereafter, the program is again entered at step 453. It can be seen that steps 452 through 456 form a loop which is operative for allowing all of the required filler rod elements to be installed in the connector one by one although the actual installation step is manually performed.

Figure 15:
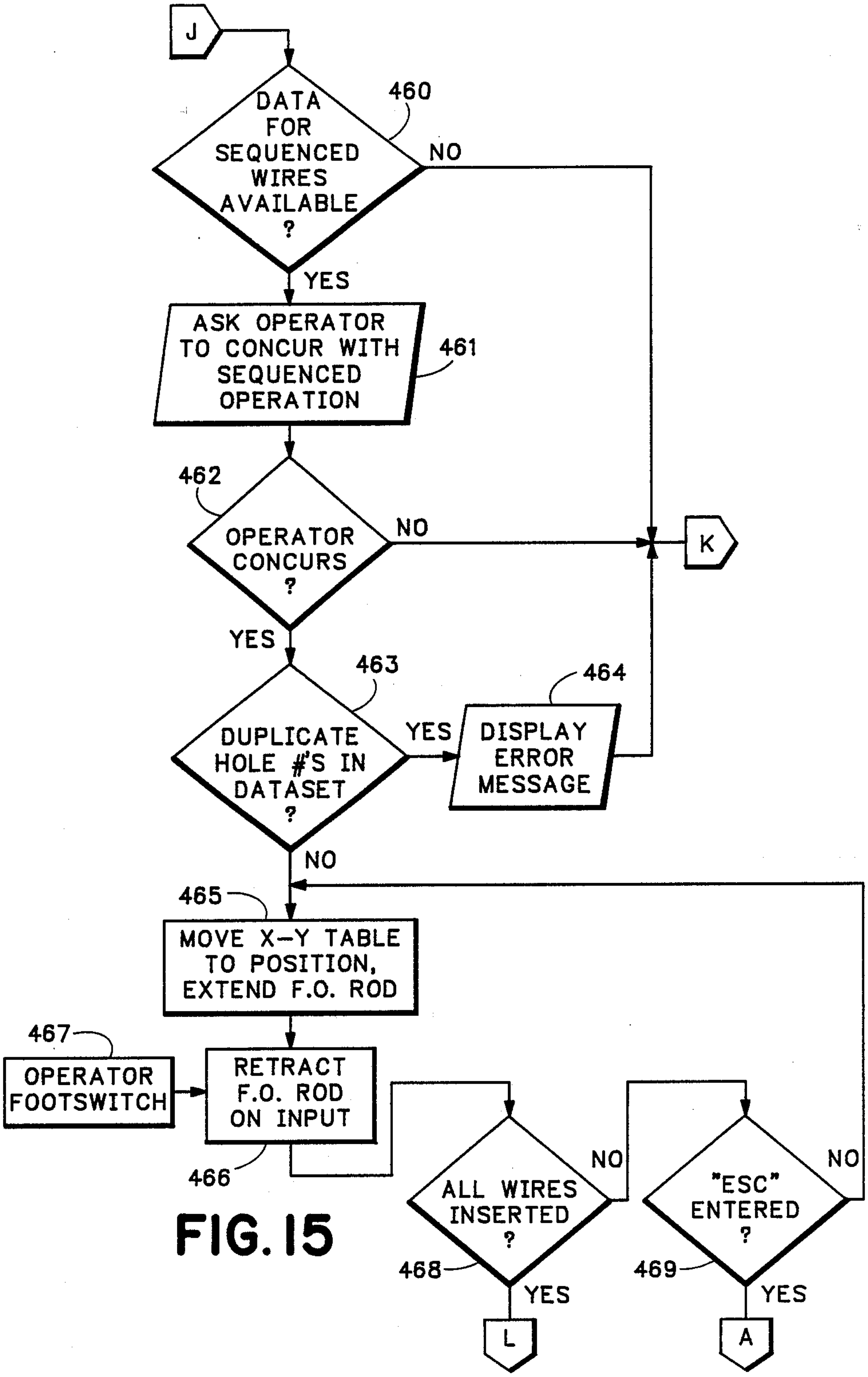

Referring now to FIG. 15, in routine J the first set of steps 460–464 involve the verification of certain preliminary conditions while the subsequent steps 465 through 469 involve actual operations in which electrical contacts are inserted into a connector. In step 460 the program checks to make sure data for sequenced operations, i.e., operations in which electrical contacts are inserted in a predetermined order, is available, and if such data is available, asks the operator to concur with sequenced operations in steps 461 and 462. If data of sequenced operations is not available, or the operator does not concur with sequenced operations, the program goes to alternative routine K. If the operator concurs with sequenced operations, then the program checks to make sure no duplicate holes exist in the operational data set and displays and error message in step 464 if any such duplicate holes are detected as it then automatically proceeds to routine K. If duplicate holes are not detected in the data set, the program moves to step 465 in which the X-Y table 42 supporting the guide assembly 40 is indexed to position the optical element 102 under the first hole corresponding to the first sequenced electrical contact, and the optical element 102 is extended into the hole. When the operator depresses the foot switch 78 as indicated in step 467, the optical element 102 is retracted from the hole pursuant to step 466 so that the operator can manually insert the electrical contact corresponding to the first sequenced wire into the hole visually indicated by the previous presence of the optical element 102. In step 468 the program checks to see whether all of the required electrical contacts have been inserted into the connector and routine L is accessed if they have. Otherwise, if all of the contacts have not been inserted into the connector, the program moves to step 469. In step 469 the operator is allowed to escape from routine J to the main menu of step 401 upon entry of an escape command, but in all other cases the program returns to step 465. It can be seen that the steps 465 through 469 form a loop whereby all of the electrical contacts required to be inserted into the connector will be inserted correctly one by one into the connector until this insertion function is complete.

Figure 16:
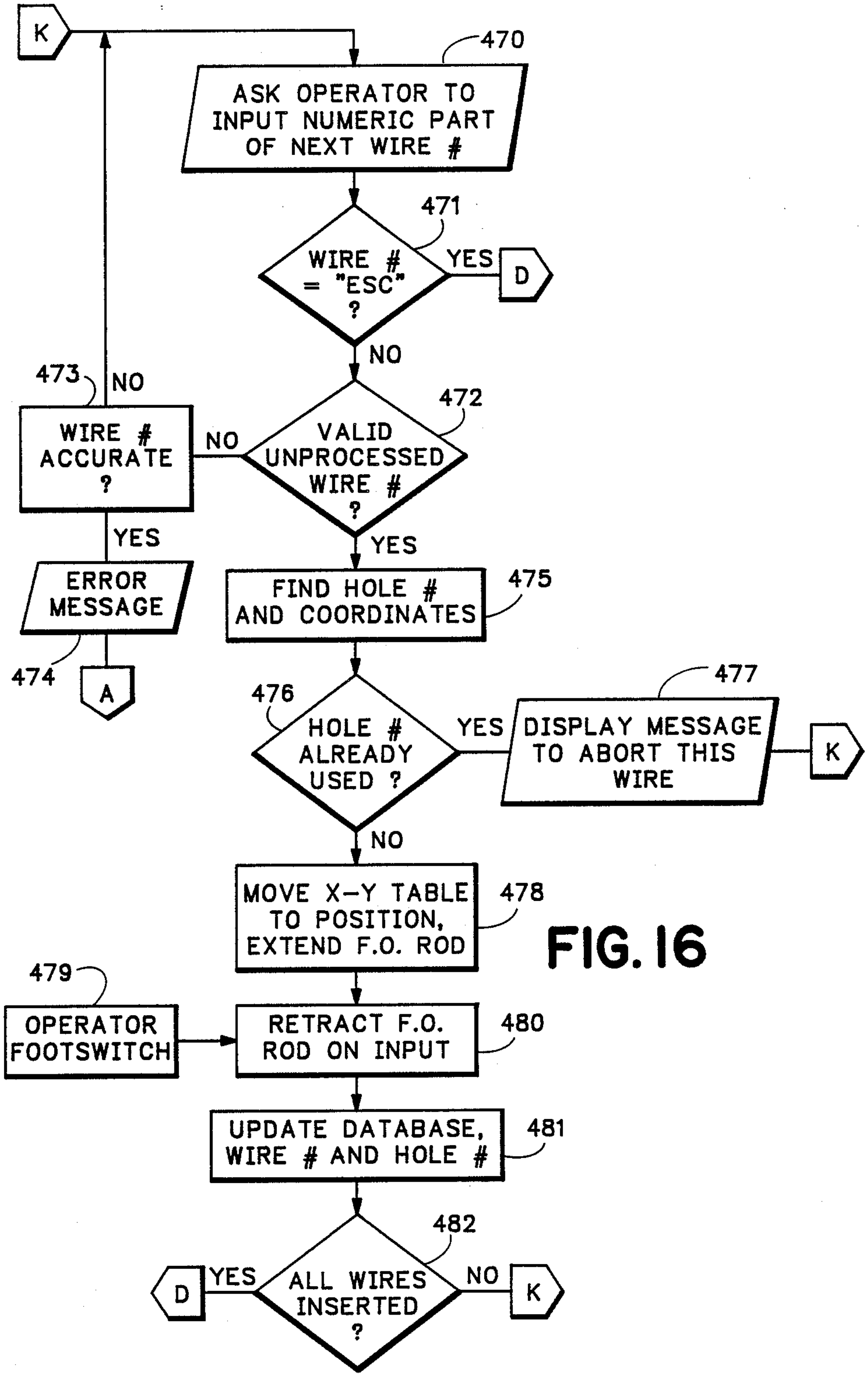

Referring now to FIG. 16, routine K begins in step 470 with the operator being queried to input the numeric part of the next wire number. If the operator instead enters an escape command, program control automatically passes to routine D via step 471. Otherwise, the program proceeds to step 472 in which it checks to make sure the wire number entered by the operator is a valid and unprocessed wire number and, if the wire number is not a valid and unprocessed wire number, moves to step 473 in which it advises the operator to check the accuracy of the wire number. If the wire number is verified by the operator as accurate, then an error message is displayed on the monitor 66 pursuant to step 474 and routine K is aborted to the main menu of step 401. If the operator indicates that the wire number was not accurate, then the program returns to step 470 whereby the wire number can be correctly entered. When a valid and unprocessed wire number is entered, the program moves to step 475 in which the proper coordinates of the hole into which the electrical contact corresponding to wire should be inserted are accessed from the connector data file. The program then checks in step 476 to make sure the hole has not already been used for the insertion of another contact and displays an error message in step 477 if it detects that the hole has in fact already been used. In such case, the program returns to restart routine K from the beginning at step 470. If it is ascertained that the hole has not already been used, then the program executes step 478 in which the X-Y table 42 supporting the guide assembly 40 is indexed to position the optical element 102 immediately underneath the hole in accordance with the coordinates previously accessed and the optical element 102 is extended up into the hole. When the operator depresses the foot switch 78 pursuant to step 479, the optical element is retracted in step 480 so as to allow the operator to manually insert the electrical contact for the selected wire into the hole in the connector indicated previously by the presence of the optical element 102. After the electrical contact is inserted, the data base for the electrical contacts and the data base for the holes are updated in step 481 to indicate that the electrical contact corresponding to the wire has been inserted into the connector and the hole within the connector has been filled with an electrical contact. Thereafter, in step 482 the program checks to see if all of the required electrical contacts have been inserted into the connector and returns to the beginning of routine K if all of the wires have not been inserted into the connector. Otherwise, the program passes to routine D since the electrical contact insertion function is indicated as having been completed for the connector being worked on.

Figure 17:
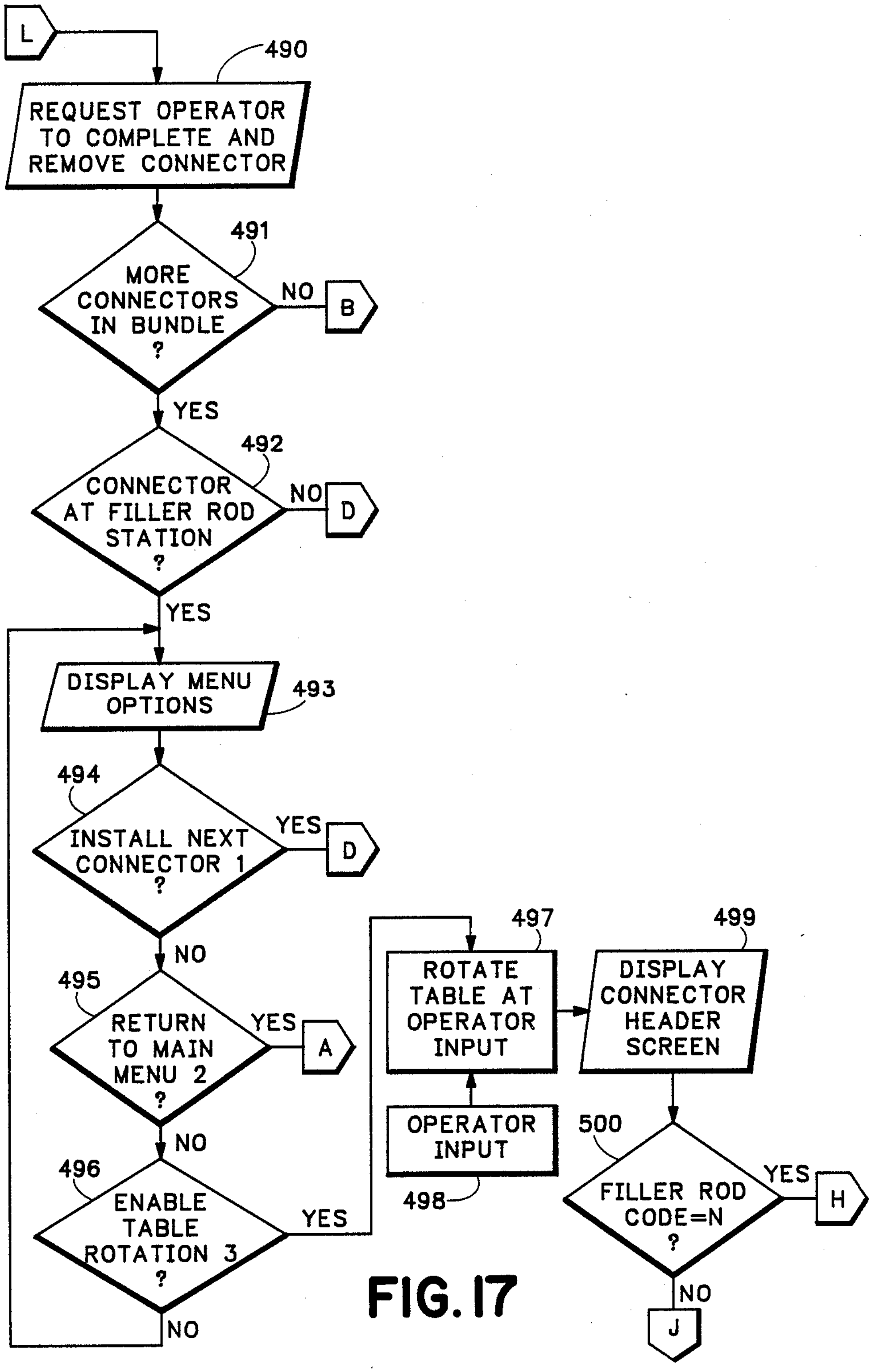

Referring now to FIG. 17, routine L begins with step 490 in which the operator is requested to remove the connector into which filler rods and electrical contacts have now been fully installed. The program then checks in step 491 as to whether more connectors need to be assembled from the currently specified bundle, and, if the bundle has been completely processed, routine B follows. Otherwise, the program moves to step 492 in which the program further checks as to whether the next connector is at the filler rod station, and if the connector is not at the filler rod station, the program enters routine D. If, however, the connector is at the filler rod station, then a series of menu options are displayed to the operator as illustrated in steps 493–496 whereby in step 494 a new connector can be installed via routine D, or in step 495 the program can return to the main menu of routine A at step 401, or in step 496 the turntable can be enabled for rotation. If the operator chooses to enable turntable rotation, then the program moves to step 497 in which the turntable is rotated, upon operator input as indicated in step 498. Once the turntable is rotated, a new connector header screen is displayed on the monitor 66 as noted in step 499 and the program checks in step 500 as to whether automatic or non-automatic filler rod insertion functions are required. The program passes either to routine J, if a non-automatic filler rod installation function is required, or to routine H, if conversely an automatic filler rod installation function is required.

Thus, the present invention provides a system for assembling electrical connectors which can automatically install filler rods in the connectors and allows for the connectors to be conveniently moved between separate positions at which electrical contacts and filler rods are inserted into the connectors and otherwise promotes operational efficiencies in the assembly process.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. In a method for assembling multiple electrical conductors into an electrical connector having multiple holes for receiving said conductors including the steps of identifying conductors and in response thereto ascertaining via electronic data lookup means the location of holes wherein given conductors are to be inserted, extending an illuminating rod into holes in response to data lookup so that a given hole is visually recognizable by an operator, and inserting a given conductor in the last mentioned hole, the improvement comprising the steps of:

electronically ascertaining the locations of the holes within said electrical connector which are to be left vacant and into which filler rod elements are required to be inserted via reference to an electronic data lookup means;

positioning a filler rod insertion tool over each of said vacant holes by controlling the movements of an X-Y table on which said tool is mounted; and feeding filler rod material into said vacant holes.

2. The method of step 1 wherein said locations of said vacant holes are ascertained by a microprocessor system operating in accordance with a program which includes lookup tables containing information about the holes to be left vacant.

3. The method of claim 1 wherein said filler rod material comprises a continuous strand of material and further including the step of clipping off said strand of filler rod material after it is fed into each of said vacant holes so as to form installed filler rod elements in said connector.

4. An apparatus for assembling filler rod elements into an electrical connector having multiple holes for receiving electrical contacts, comprising:

control means for specifying the locations of said holes within said connector into which filler elements are required to be inserted;

means for automatically inserting filler rod elements into said holes in said connector in response to control signals from said control means, including means for separately feeding a continuous strand of filler rod material into each of the holes in said connector, and means for clipping off said strand of filler rod material after it has been fed into each of said holes; and translation means for transversely positioning said means for inserting filler rod elements in response to control signals from said control means.

5. The apparatus of claim 4 wherein said control means includes a microprocessor system programmed to ascertain the locations of said holes via lookup tables specific to each connector which the apparatus may process.

6. An apparatus for assembling filler rod elements into an electrical connector having multiple holes for receiving electrical contacts, comprising:

control means for specifying the locations of said holes within said connector into which filler elements are required to be inserted;

means for inserting filler rod elements into said holes in said connector in response to control signals from said control means, including means for separately feeding a continuous strand of filler rod material into each of the holes in said connector, and means for clipping off said strand of filler rod material after it has been fed into each of said holes; and translation means for transversely positioning said means for inserting filler rod elements in response to control signals from said control means;

wherein said means for inserting filler rod elements further includes pneumatic cylinder means for longitudinally positioning said means for inserting filler rod elements over said electrical connector in response to control signals from said control means.

7. An apparatus for assembling filler rod elements into an electrical connector having multiple holes for receiving electrical contacts, comprising:

control means for specifying the locations of said holes within said connector into which filler elements are required to be inserted;

means for inserting filler rod elements into said holes in said connector in response to control signals from said control means, including means for separately feeding a continuous strand of filler rod material into each of the holes in said connector, and means for clipping off said strand of filler rod material after it has been fed into each of said holes; and translation means for transversely positioning said means for inserting filler rod elements in response to control signals from said control means;

wherein said means for separately feeding filler rod material includes clutch means for controllably gripping said strand of filler rod material.

8. An apparatus for assembling filler rod elements into an electrical connector having multiple holes for receiving electrical contacts, comprising:

control means for specifying the locations of said holes within said connector into which filler elements are required to be inserted;

means for inserting filler rod elements into said holes in said connector in response to control signals from said control means, including means for separately feeding a continuous strand of filler rod material into each of the holes in said connector, and means for clipping off said strand of filler rod material after it has been fed into each of said holes; and translation means for transversely positioning said means for inserting filler rod elements in response to control signals from said control means;

wherein said means for inserting filler rod elements further includes pneumatic cylinder means for driving said means for feeding filler rod material and said means for clipping filler rod material.

9. An apparatus for assembling filler rod elements into an electrical connector having multiple holes for receiving electrical contacts, comprising:

control means for specifying the locations of said holes within said connector into which filler elements are required to be inserted;

means for inserting filler rod elements into said holes in said connector in response to control signals from said control means, including means for separately feeding a continuous strand of filler rod material into each of the holes in said connector, and means for clipping off said strand of filler rod material after it has been fed into each of said holes; and translation means for transversely positioning said means for inserting filler rod elements in response to control signals from said control means;

wherein said translation means includes an X-Y table on which said means for inserting filler rod elements is mounted.

10. In an apparatus for assembling multiple electrical conductors into an electrical connector having multiple holes for receiving said conductors including means for identifying given conductors and in response thereto ascertaining via electronic data lookup means the location of holes wherein said given conductors are to be inserted, means for extending an illuminating rod into holes in response to data lookup so that a given hole is visually recognizable by an operator, and means for inserting a given conductor in the last mentioned hole, the improvement comprising:

means for electronically ascertaining the locations of the holes within said electrical connector which are to be left vacant and into which filler rod elements are required to be inserted via reference to an electronic data lookup means;

means for positioning a filler rod insertion tool over each of said vacant holes;

means for feeding filler rod material into said vacant holes; and turntable means for mounting said connector and revolving said connector between different positions at which said illuminating rod can be extended into holes in said connector and at which said filler rod material can be fed into holes in said connector.

11. The improvement of claim 10 wherein said filler rod material comprises a continuous strand of material and further including means for clipping off said strand of filler rod material after it is fed into each of said vacant holes so as to form installed filler rod elements in said connector.

12. The improvement of claim 10 further comprising a microprocessor system for providing said electronic data lookup functions and controlling and coordinating the operations of the components of said apparatus.

13. A tool for use in inserting filler rod elements into the holes which are to be left vacant within an electrical connector having multiple holes for receiving electrical contacts, said tool comprising:

a double-acting pneumatic cylinder including a cylinder casing and a pneumatically actuated piston having an axially-aligned passageway extending centrally therethrough so as to allow a strand of filler rod material to be supplied longitudinally through said cylinder;

a first clutch means attached to said piston for gripping said strand of filler rod material so that said strand can be pushed into one of the holes of said connector as said piston moves toward said connector;

a second clutch means attached to said casing for gripping said strand of filler rod material so that said strand can be held stationary as said piston moves away from said connector; and clipping means attached to said casing but actuated by said piston for severing said strand of filler rod material after it has been fed into one of said holes.

14. The tool of claim 13 wherein said first and second clutch means includes a set of ball bearing positioned in a conical cavity concentric with said strand of filler rod material.

15. The tool of claim 13 wherein said clipping means includes a pair of jaws mounted on the end of said cylinder so as to be rotatable around separate axes on opposite sides of said strand of filler rod material.

16. The tool of claim 13 further including stopping means for adjustably limiting the length of the stroke of said piston.

17. An apparatus for assembling electrical contacts and filler rod elements into an electrical connector, comprising:

control means for specifying the unused holes within said connector into which filler rod elements are required to be installed and the particular holes within said connector into which particular electrical contacts must be inserted;

means for automatically installing filler rod elements into said unused holes in said connector in response to control signals from said control means, including means for separately feeding a continuous strand of filler rod material into each of the holes in said connector and for clipping off said strand of filler rod material after it has been fed into each of said holes;

translation means for transversely positioning said means for installing filler rod elements in response to control signals from said control means;

means for visually identifying holes within said connector into which electrical contacts must be inserted in response to control signals from said control means including means for advancing and retracting an optical element into and out of each of said holes; and translation means for transversely positioning said means for visually identifying holes within said connector in response to control signals from said control means.

18. The apparatus of claim 17 wherein said means for installing filler rod elements further includes pneumatic cylinder means for longitudinally positioning said means for installing filler rod elements over said electrical connector in response to control signals from said control means.

19. The apparatus of claim 17 wherein said means for separately feeding filler rod material includes clutch means for controllably gripping said strand of filler rod material.

20. The apparatus of claim 17 wherein said means for installing filler rod elements further includes pneumatic cylinder means for driving said means for feeding filler rod material.

21. The apparatus of claim 17 wherein said translation means include X-Y tables on which said means for installing filler rod elements and said means for visually identifying holes are mounted.

22. The apparatus of claim 17 wherein said control means includes a microprocessor system programmed to ascertain the locations of said holes for filler elements and electrical contacts via lookup tables specific to each connector which the apparatus may process.

* * * * *